United States Patent
Pankratz et al.

(10) Patent No.: US 10,475,622 B2
(45) Date of Patent: Nov. 12, 2019

(54) SYSTEM AND METHOD FOR PLASMA IGNITION

(71) Applicant: Advanced Energy Industries, Inc., Fort Collins, CO (US)

(72) Inventors: Josh Pankratz, Fort Collins, CO (US); Craig Linn, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 16/141,529

(22) Filed: Sep. 25, 2018

(65) Prior Publication Data

US 2019/0096633 A1 Mar. 28, 2019

Related U.S. Application Data

(60) Provisional application No. 62/563,504, filed on Sep. 26, 2017.

(51) Int. Cl.
*H05B 33/00* (2006.01)
*H01J 37/32* (2006.01)

(52) U.S. Cl.
CPC .. *H01J 37/32064* (2013.01); *H01J 37/32027* (2013.01); *H01J 37/32045* (2013.01);
(Continued)

(58) Field of Classification Search
CPC ........... H01L 2924/01006; H01L 29/78; H01L 27/088; H01L 2924/01013; H01L 2924/01015; H01L 2924/01073; H01L 2924/14; H01L 2924/1433; H01L 2924/1306; H01L 29/42324; H01L 2924/00; H01L 21/306; H01L 2224/04105; H01L 2224/16; H01L 2224/76155; H01L 2224/82102; H01L 24/18; H01L 24/20; H01L 24/82; H01L 2924/01005; H01L 2924/01011; H01L 2924/01012; H01L 2924/01019; H01L 2924/0102; H01L 2924/01023; H01L 2924/01024;
(Continued)

(56) References Cited

U.S. PATENT DOCUMENTS 5,718,813 A  2/1998 Drummond et al.
9,111,733 B2  8/2015 Freeborn et al.
(Continued)

FOREIGN PATENT DOCUMENTS

WO  2014036169 A1  3/2014

OTHER PUBLICATIONS

International Searching Authority, International Search Report and Written Opinion, for international application No. PCT/US2018/052671, dated Jan. 3, 2019 (16 pages).

*Primary Examiner* — Monica C King
(74) *Attorney, Agent, or Firm* — Polsinelli PC

(57) ABSTRACT

This disclosure is generally directed to controlling energy distribution to a load, especially when anomalous events are detected. Benefits of the present disclosure include minimizing the length of a discharge event, mitigating the effects of an electrical discharge, and to improvements in inducing the ignition of a plasma. Methods and systems consistent with the present disclosure improve the control of operating conditions within a chamber and improve the ability for more rapidly initiating plasma ignition in a chamber.

21 Claims, 5 Drawing Sheets

(52) U.S. Cl.
CPC .. *H01J 37/32697* (2013.01); *H01J 37/32935* (2013.01); *H01J 37/32944* (2013.01); *H01J 37/32816* (2013.01); *H01J 2237/0203* (2013.01)

(58) Field of Classification Search
CPC . H01L 2924/01027; H01L 2924/01029; H01L 2924/0103; H01L 2924/01033; H01L 2924/01046; H01L 2924/01047; H01L 2924/01052; H01L 2924/01056; H01L 2924/01059; H01L 2924/01074; H01L 2924/01075; H01L 2924/01082; H01L 2924/13091; H01L 2924/19041; H01L 2924/19042; H01L 2924/19043; H01L 2924/30105; H01L 2924/3011; H01L 2924/3025; H01L 29/788; H01L 21/82; H01L 27/10814; H01L 27/11; H01L 29/7869; H01J 37/3444; H01J 37/3467; H01J 43/20; H01J 2237/334; H01J 37/32183; H05H 1/46; H05H 2001/4682
See application file for complete search history.

(56) References Cited

U.S. PATENT DOCUMENTS

| | | |
|---|---|---|
| 9,673,028 B2 | 6/2017 | Walde et al. |
| 2010/0140231 A1 | 6/2010 | Ilic |
| 2011/0048924 A1 | 3/2011 | Freeborn et al. |
| 2014/0231243 A1* | 8/2014 | Finley .................. H05H 1/46 204/192.12 |

* cited by examiner

SYSTEM AND METHOD FOR PLASMA IGNITION

CROSS-REFERENCE TO RELATED APPLICATION

This application is related to and claims priority under 35 U.S.C. § 119(e) from U.S. Patent Application No. 62/563,504, filed Sep. 26, 2017 entitled "UTILIZING ARC MANAGEMENT TO IMPROVE PLASMA IGNITION IN LOWER PRESSURE ENVIRONMENTS," the entire contents of which is incorporated herein by reference for all purposes.

TECHNICAL FIELD

The present disclosure is generally directed to igniting a plasma in a plasma generator. More specifically the present disclosure is directed to igniting a plasma in low pressure environments.

BACKGROUND

In nature and in a plasma generator, electrical charge can move by the movement of electrons or by the movement of ions. Plasmas are characterized by the movement of gas ions and plasma manufacturing processes rely on the movement of gas ions when a product is manufactured.

A problem associated with plasma manufacturing is that it can be difficult to initiate a plasma state in lower pressure conditions. Ignition difficulty at low pressures may be related to the fact that a gas within the chamber is present in a low density where there may be relatively few gas ions and neutral atoms available to collide. Collisions of this sort are called ionizing collisions that generate a level of ionization. Without sufficient collisions, a degree of ionization necessary to ignite the plasma may not be achieved. Difficulty of igniting a plasma at lower pressures may also relate to the topology of a processing chamber and the movement of ions and neutral atoms may not be optimal to ignite the plasma. Furthermore, other limitations associated with a particular manufacturing process may prevent sufficient ignition voltage levels from being provided to a plasma chamber as such voltages may damage a product that is being manufactured using the plasma.

Since certain forms of plasma processes are optimized for lower pressures and since plasma ignition is more difficult to initiate at lower pressures, systems and methods that ignite or re-ignite a plasma state more easily in low pressure conditions are needed. Benefits associated with being able to initiate or to ignite a plasma in lower pressure environments include increased product throughput of a manufacturing process and greater utility of capital equipment. As such, methods and systems for improving the plasma ignition in lower pressure environments are beneficial to the operation of plasma processing applications.

It is with these observations in mind, among others, that aspects of the present disclosure were conceived.

SUMMARY

The present disclosure is directed to methods, apparatus, and electrical systems/circuits related to plasma ignition. A method consistent with the present disclosure may include changing voltages applied to a plasma chamber from a first voltage level to a second voltage level until a plasma is ignited in the plasma chamber during a plasma chamber ignition process. Both the first voltage level and the second voltage level applied to the chamber may be voltages that are different from a DC operating voltage to maintain the plasma and the DC operating voltage may be a voltage level that is between the first voltage level and the second voltage level. In one example, the first and second voltage level is achieved by shunting a rail voltage (e.g., some DC voltage) through operation of a switch to a second rail voltage, which may be the return rail to a power supply. In another example, the polarity of the upper rail voltage is changed, e.g., negative to positive, by a capacitor charge/discharge operation, that alternatively couples switches to charge the capacitor and provide rail voltage to the chamber, and then provide the switched in capacitor voltage to the chamber by connecting the capacitor to the second (return) rail.

An apparatus consistent with the present disclosure may include a controller and one or more switches, which may be of various forms of electrical switching elements including a transistor, where the controller may controllably change voltages applied to the plasma chamber by closing and opening the one or more switches during a plasma chamber ignition process. Such a plasma chamber ignition process may include changing voltages applied to a plasma chamber from a first voltage level to a second voltage level until the plasma is identified as begin ignited in the plasma chamber. Both the first voltage level and the second voltage level applied to the chamber may be voltages that are different from a nominal operating voltage of the plasma chamber and the nominal operating voltage may be a voltage level that is between the first voltage level and the second voltage level.

Apparatus consistent with the present disclosure may also include a first and a second (or return) rail of a power supply that form an electrical link between a direct current (DC) plasma chamber and a power supply. The first and second rails may also be referred to as an upper rail and a lower (or return) rail. Such an apparatus may include a plurality of switches that electrically couple the positive rail to the chamber or the positive rail to the negative rail (through a diode) of the power supply. Or, the switches may be arranged to alternatively charge a capacitor and then use the charged capacitor to reverse the polarity of the plasma voltage. The plurality of switches may be controlled by a controller to switch between a first and a second switch configuration in a sequence that causes a first voltage and then a second voltage to be applied to the DC plasma chamber until plasma is ignited in the DC plasma chamber.

DETAILED DESCRIPTION

The present disclosure is generally directed to controlling energy distribution to a load, and particularly for igniting and sustaining a plasma load. One particular advantage of the system and methods disclosed herein is for relatively low pressure plasma ignition and sustainment. More particularly, benefits of the present disclosure include, but are not limited to, inciting plasma ignition in a plasma generator more consistently and rapidly in low pressure environments than possible by conventional means. This may be required to initiate or maintain a manufacturing process that is performed at low pressures. Methods and systems consistent with the present disclosure improve the control of operating conditions within a chamber and improve the ability for more rapidly initiate plasma ignition in a plasma chamber.

A voltage changing circuit consistent with the present disclosure may vary a voltage applied to a plasma chamber in order to initiate plasma ignition more efficiently and effectively. In one example, a DC plasma voltage is initially pulsed by diverting (shunting) current from the rail by way of the circuit. The initial pulsed DC ignition voltage is able to better ignite plasmas in low pressure environments. Generally speaking, based on Paschen's curve, increasing voltages (negatively, in some examples) are required to ignite a plasma at decreasing pressures. In some instances, required voltages exceed or are near the allowable chamber voltages making ignition challenging. By exciting (pulsing), the ignition sequence of an otherwise DC plasma system, electrons are distributed about the chamber increasing the likelihood of an ionizing event leading to plasma ignition. In one example, a chamber pressure of about 1 millitorr is a level at which plasma ignition becomes challenging with conventional DC systems. In one particular example, the same circuit used to mitigate energy discharge or electrical arcing may also be applied to starting or re-starting the ignition of a plasma. Through a controller coupled with the circuit, low pressure plasma ignition routines may be run using the circuit as well as arc mitigation, albeit with different control schemes.

Figure 1:
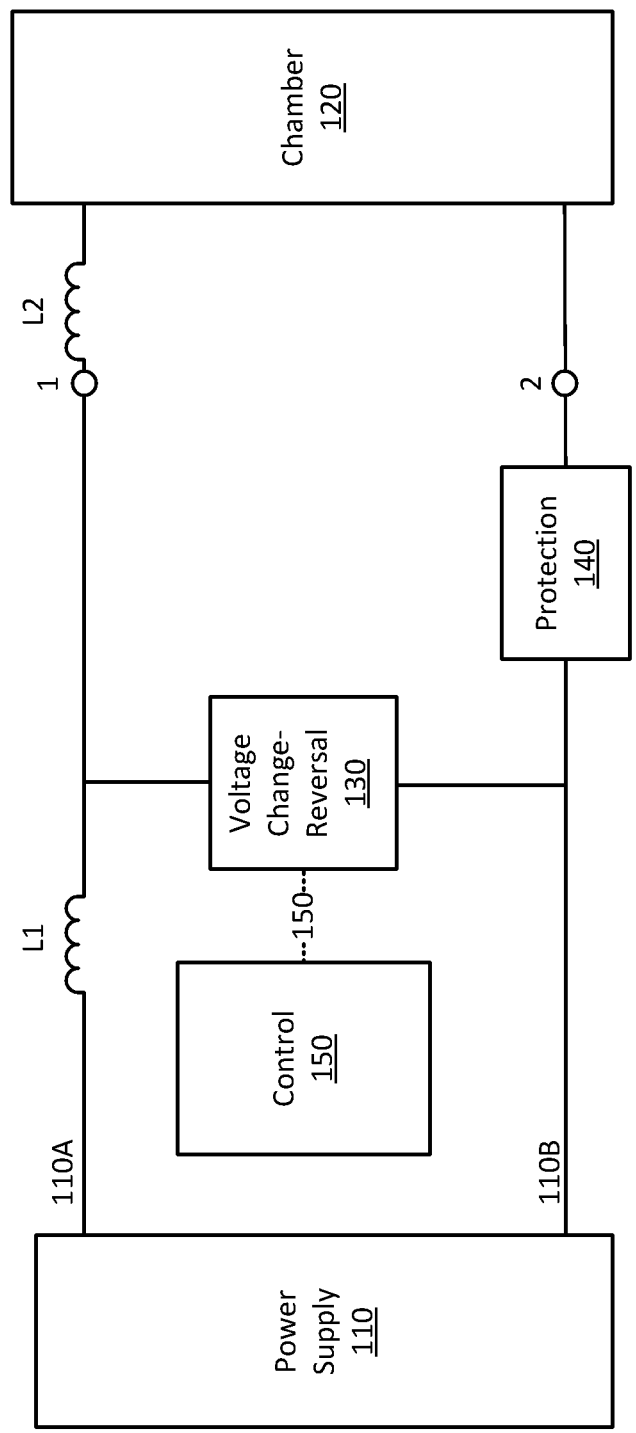
FIG. 1 is a block diagram of a power supply circuit for a plasma processing system.

FIG. 1 illustrates an exemplary block diagram of system that includes a power supply coupled to a chamber. The system of FIG. 1 may be part of a more expanded plasma processing system. In particular, FIG. 1 includes power supply 110 (e.g., a DC, pulse-width modulated voltage source) that may be disposed to apply pulsed DC power to a plasma chamber 120 with a supply cable to facilitate any of a variety of plasma processing applications known to those of skill in the art. As depicted, power supply 110 is also controllably connected to voltage change-reversal circuit 130.

Components illustrated in FIG. 1 may be implemented by various means, and an implementation may differ in appearance from the depiction in FIG. 1. For example, the depicted functions may be implemented by shared components so that these discrete functions may not have corresponding discrete hardware or software constructs. Moreover, the depicted functional components may be realized by hardware and software components that are spatially distributed about a power supply. FIG. 1 also includes inductor L1 as well as inductance L2 that may include discrete components or the inductance of a cable (or "cable inductance"). Note that power supply 110 includes a first output 110A and a second output 110B. Inductor L1 may be used to isolate the power supply 110 from other components by providing an impedance between the first terminal 110A of the power supply 110 and other components. The inductance L2 as mentioned above, may be an inductance associated with cables attached to input terminal 1 of chamber 120. Protection component 140 is coupled to terminal 2 of chamber 120 to provide isolation between terminal 2 of the chamber 120 and the power supply 110 and the voltage change-reversal circuit 130.

As shown, the components of FIG. 1 include a voltage change-reversal component 130 that generally operates to more reliably ignite plasma in chamber 120. Additionally voltage change-reversal component 130 may be used to extinguish electrical arcs that may occur in chamber 120 when such electrical arcs are detected. Voltage change-reversal component 130 may operate under the control of controller 150, where controller 150 controls whether the upper rail is coupled to the chamber or coupled to the lower rail to provide a shunt pulse, or whether a reverse voltage (e.g., positive voltage) is applied to the upper rail. As such, controller 150 may control how much voltage is applied to the chamber 120 at a given moment. Such voltages may be greater than, less than, or have a polarity opposite to a nominal voltage supplied across terminals 110A and 110B of the power supply 110. Voltage change reversal component 130 may pulse the supply voltage or reverse the voltage to a same or near same voltage (with opposite polarity) as the nominal voltage applied by power supply 110 during normal operation of chamber 120. Pulsing or voltage reversal may occur during a plasma ignition process or may occur to extinguish an electrical arc detected in chamber 120.

Also shown is a protection component 140 that operates to prevent the relatively high reverse voltage that may be imparted by voltage change-reversal component 130 from being applied to a plasma load in the chamber 120. Protection components consistent with the present disclosure may be implemented by various means and will typically operate as a current controlled switch that may help prevent a large reverse arc handling voltage from being applied to the chamber 120 based on protection component 140 preventing current flow into terminal 2 of chamber 120 when a reverse voltage is applied by voltage change-reversal component 130.

The control component 150 may be realized by hardware, software in combination with hardware, firmware, or combinations thereof. Control components may include conventional computers, processors, digital signal processors (DSP), graphic processors, digital logic, or analog devices. Control components may be implemented by devices that include application specific integrated circuit (ASICS) or field programmable gate arrays (FPGAS), for example. Applications of systems and methods consistent with the present disclosure are not necessarily limited to plasma manufacturing systems as they may benefit other applications where arcing occurs in system that relies on a controlled plasma. For example, systems and methods of the present disclosure may help optimize the performance or utility of a plasma rocket engine.

Figure 2:
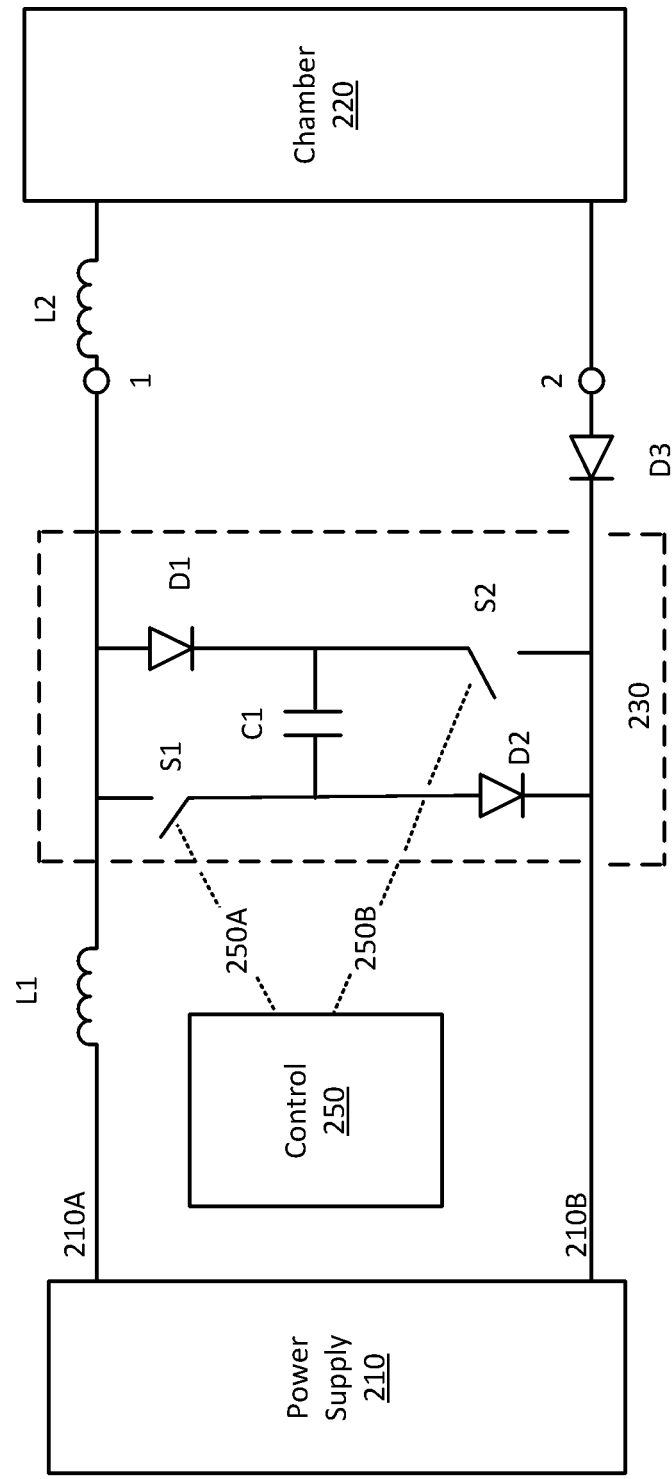
FIG. 2 is circuit diagram of an exemplary block power supply circuit consistent with the present disclosure.

FIG. 2 is circuit diagram of an exemplary power supply circuit consistent with the present disclosure. FIG. 2 depicts a specific example implementation of the power supply circuit of FIG. 1; however, it should be recognized that the specific implementation in FIG. 2 is only an exemplary implementation of the more general depiction and that alternative approaches may be utilized to realize the components illustrated in FIG. 1, as well as the methods disclosed herein. Power supply 210 provides power to power contacts 1 and 2 of chamber 220 from a first contact 210A and a second contact 210B. Between power supply 210 and chamber 220 are a control circuit 250, a voltage change-reversal circuit 230, and a protection diode D3. The power supply and associated first and second contact may be a positive and negative (or ground) and may also be configured to provide a negative voltage at the upper rail, with a lesser voltage at the lower rail.

The voltage change—reversal circuit of FIG. 2 may pulse the voltage to the chamber or may reverse voltage. To ignite plasma in chamber 220, switches S1 and S2 may be switched according to different controlled sequences. These sequences may change the voltage applied to chamber 220. The closing of switches S1 and/or S2 may change a voltage applied to the chamber in different ways. For shunt pulsing, S1 or S2 may be closed to connect the upper rail to the lower rail, dropping the chamber voltage. A shunt pulsing embodiment may only include one or the other diode switch pair (e.g., only S1 and D2 or only D1 and S2) and does not involve the capacitor. To reduce stress on the components, S1/D2 pulse conduction may be interleaved with S2/D1 pulse conduction (e.g., every other pulse is initiated by switching between closing switch S1, and then closing switch S2, and back to S1 and so on.

For voltage reversal, the circuit includes capacitor C1 that may be charged by the positive 210A and negative 210B rails of the power supply 210 through diodes D1 & D2 to provide a voltage for used by the voltage change-reversal circuit 230. The voltage change-reversal circuit 230 may also include switches S1 and S2. Capacitor C1 is charged because current will flow through diodes D1 and D2 and capacitor C1 when switches S1 and S2 are open, until capacitor C1 is charged to or near a voltage supplied by power supply 210 via terminals/rails 210A and 210B. By closing both switches, the voltage is reversed to the chamber by connecting the capacitor to the lower rail. By opening both switches, the capacitor is recharged and the supply voltage is the chamber is returned to the upper rail voltage. The sequence may be repeated for a period of time or until plasma ignition is recognized.

As mentioned above, voltage change-reversal circuitry 230 may also be used to extinguish arcs. In an instance when an arc is detected, power supply 210 may be shutoff or switches not illustrated in FIG. 2 may be used to disconnect power supply 210 from being electrically connected to chamber 220. After an arc detection, switches S1 and S2 may be closed such that capacitor C1 would apply a reverse voltage to chamber 220 connectors 1 and 2. The closing of switches S1 and S2 reverse the voltage applied to chamber 220 because the side of capacitor C1 connected to diode D1 is now electrically connected to protection component D3 and the side of capacitor C1 connected to diode D2 is now electrically connected to terminal 1 of chamber 220. Furthermore, when switches S1 and S2 are closed, diodes D1 and D2 stop conducting because of the reverse voltage. The reverse voltage, when applied to chamber 220, will rapidly stop the flow of electrons associated with the arcing detected within chamber 220 because the arcing requires a voltage with a polarity opposite to the reverse voltage to exist.

When the reverse voltage is provided to chamber 220, protection component diode D3 may stop conducting current because of the reverse voltage, as such an amount of reverse current may be prevented from flowing through chamber 220. This is because at that time protection diode D3 may be reverse biased. As such protection components, like protection component 140 of FIG. 1 or the exemplary diode D3 of FIG. 2 may operate as a current controlled switch that opens or stops conducting when a load current flowing through the chamber approaches zero amps. Here again, the protection components consistent with the present disclosure may operate as a current controlled switch that may help prevent a large reverse arc handling voltage from being directly applied across both terminals 1 and 2 chamber 220.

During an initial start of plasma ignition or after an arc-handling shutdown is complete and the plasma ignition must be restarted, the voltage change-reversal circuit 230 may be utilized to improve plasma ignition in lower pressures, where ignition may conventionally be challenging. Ignition difficulty at low pressures may relate to the fact that a gas within the chamber is present in a low density where there may be relatively few gas ions and neutral atoms available to collide. Collisions of this sort are called ionizing collisions that generate a level of ionization; without sufficient collisions, a degree of ionization necessary to ignite the plasma may not be achieved. Difficulty of igniting a plasma at lower pressures may also relate to the topology of a processing chamber the movement of ions and neutral atoms may not be optimal to ignite the plasma. Furthermore, other limitations associated with a particular manufacturing process may prevent a voltage from being provided to a plasma chamber that is greater than a threshold level as voltages above that threshold level may be associated with damaging a product that is being manufactured using the plasma.

Figure 3A:
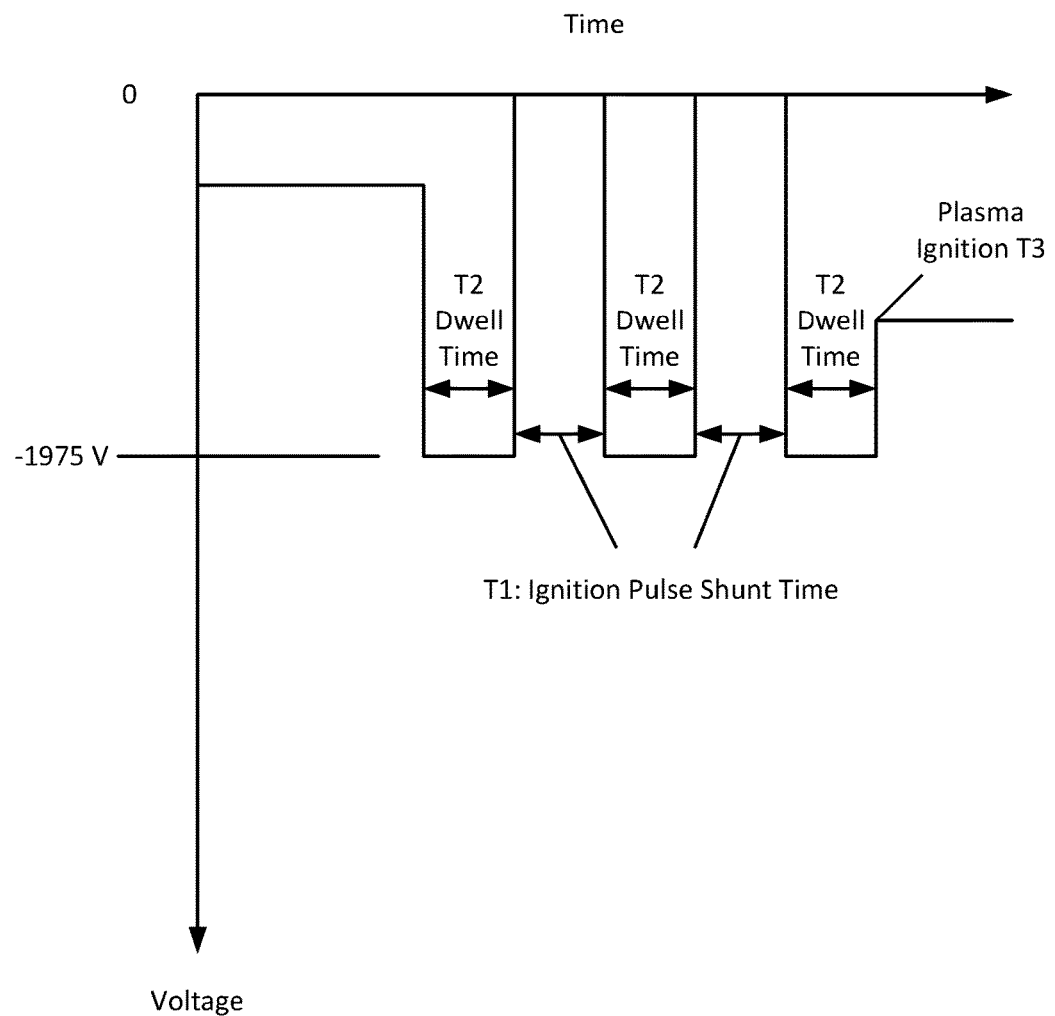
FIG. 3A is an exemplary timing diagram that illustrates the changing of a voltage during a plasma ignition sequence.

In an example, the low pressure ignition circuit and associated technique, may work particularly well in systems that utilize DC power sources for the plasma chamber. In one implementation, controller 250 may operate switch S1 or S2 to initiate a shunt operation of the power supply circuit to divert or alter the rail voltage applied to the chamber. For a shunt operation, as shown in FIG. 3A discussed below, S1 or S2 may be closed for a shunt, or closing switch S1 may be alternated with closing switch S2 to distribute and reduce stress on either component. In a modified example of the switching circuit of FIG. 2, only a combination of S1 and D2 or D1 and S2 may be employed as the shunt circuit. The shunt operation involves controllably opening and closing the switch or switches, which may be at a preferred frequency. In one example, the shunt pulses are at about −1900 volts with a dwell time of about 1300 micro-second (μsec), and separation of 1400 μsec, although there are countless other possibilities depending on chamber and plasma characteristics, process requirements, etc. This may produce a varying ignition power and voltage to be applied to the chamber 120, which varying voltage may be associated with a waveform with multiple edges during an ignition cycle. Each rising or falling edge may increase the probability of ionizing collisions sufficient enough to generate a necessary degree of ionization to ignite the plasma. Higher voltage change over time (dV/dt) related to rising or falling edges may increase the probability that moving ions may collide (impact) to cause plasma ignition. In particular, opening and closing the switch at a given frequency provides multiple transitions of the ignition power between a lower voltage provided to chamber 220 and a higher voltage provided to chamber 220. By applying different voltages across the chamber 220, electrons may flow between the inputs to the chamber which provides a higher probability of plasma ignition in the chamber. Conventional power supply systems that use DC power may not achieve the electron flow between the inputs that is obtained through the operation of the switching device to apply a varying input ignition waveform (voltage) to the otherwise DC ignition signal (voltage). In other words, by varying the DC voltage applied to the chamber 220 through the operation of the switching device (e.g., voltage change-reversal circuit 230), plasma ignition may occur at lower pressures than systems that utilize DC power that do not have such a switching ignition system. Inductor L1 of FIG. 2 may help isolate power supply 210 from voltages applied to chamber 220 when either switch S1 or S2 are closed during an ignition process, and may also take advantage of arc handling capabilities.

FIG. 3A is an exemplary timing diagram that illustrates the changing of an ignition voltage to the chamber and plasma during a plasma ignition sequence. The changing voltage of FIG. 3A is an exemplary waveform, where a voltage applied to a plasma chamber can be varied to ignite a plasma. The waveform of FIG. 3A may be achieved by a switching device (such as switches S1 or S2 of the power supply circuit of FIG. 2, for example) switching at a given frequency. When the switch device is opened, an ignition voltage is applied to the chamber, at times T2 or "dwell time." During times T1 (ignition pulse shunt time), the switching device may be closed to enter a shunting operation of the circuit (reducing the applied voltage to a lower voltage than the rail voltage). Note that initially a voltage applied to a plasma chamber may be set at the offset voltage of FIG. 3B. This offset voltage may be at a negative voltage below zero volts (0V) that is also illustrated in FIG. 3A. An example of a shunting operation is when either of switches S1 or S2 of FIG. 2 are closed in a sequence that changes a voltages applied to the chamber over a time frame. At this time, inductor L1 of FIG. 2 may isolate power supply 210 from this changing voltage. A shunting operation switching sequence may allow a voltage drop across inductance L2 to persist based on an impedance associated with inductance L2 and based on a time constant associated with inductance L2. During the shunting operation, diodes D1 and D2 may be biased, allowing the voltage across a chamber to be modified when switches S1 or S2 are closed in a sequence. This process may be repeated (opening the switching device to apply the ignition voltage and closing the switching device for shunting operation) until the plasma ignition occurs. Note that FIG. 3A illustrates the chamber voltage changing from the initial offset voltage to a high negative voltage that may be minus 1975 volts (−1975 V) during times T2 (dwell time) and changing from that −1975 V to zero volts (0V) during time T1. Note that time T2 may correspond to a time of 1300 micro-seconds (μsec) and that time T2 may be 1400 μsec, for example. Through this operation, plasma ignition is improved as ignition may occur faster and at a lower pressure than systems that do not have such a switching component. Note that the voltage applied to the plasma generator transitions a number of times from a higher voltage to a lower voltage and back several times until plasma ignition occurs at time T3. In FIG. 3A, the closing of switch S1 or switch S2 may cause the chamber voltage to reduce to −1975 volts at times T2, then when switch S1 is opened, the chamber voltage may change to zero volts (0V), for example. The closing and opening of switches S1 and S2 may be used to control how long a high pulsed negative voltage will be applied to a plasma chamber and may be used to control how long the applied chamber voltage will be set at zero volts. Depending on specific implementations, for example, the closing of switch S1 and S2 independently may have a similar shunting effect that results in a same voltage being applied to the plasma chamber. Alternatively, different switches may be used to set a first voltage level and a second voltage level that is applied to the plasma chamber at different times during a plasma ignition process according to specific configurations of a voltage change circuit.

The applied chamber voltage may go positive, for example, when both switch S1 and switch S2 are closed for a period of time, otherwise the voltage applied to the chamber may be controlled at a point between zero volts and the high pulsed negative voltage level, for example. The across a plasma chamber at and after time T3 may (after the time that the plasma is ignited), may be minus 300 to minus 400 volts, for example. In certain instances the voltage dropped across the chamber may be a function by the plasma itself. As such an operational plasma voltage may be set by the gas when in a plasma state. Plasma ignition may be detected by an increase in a current provided to the chamber.

Figure 3B:
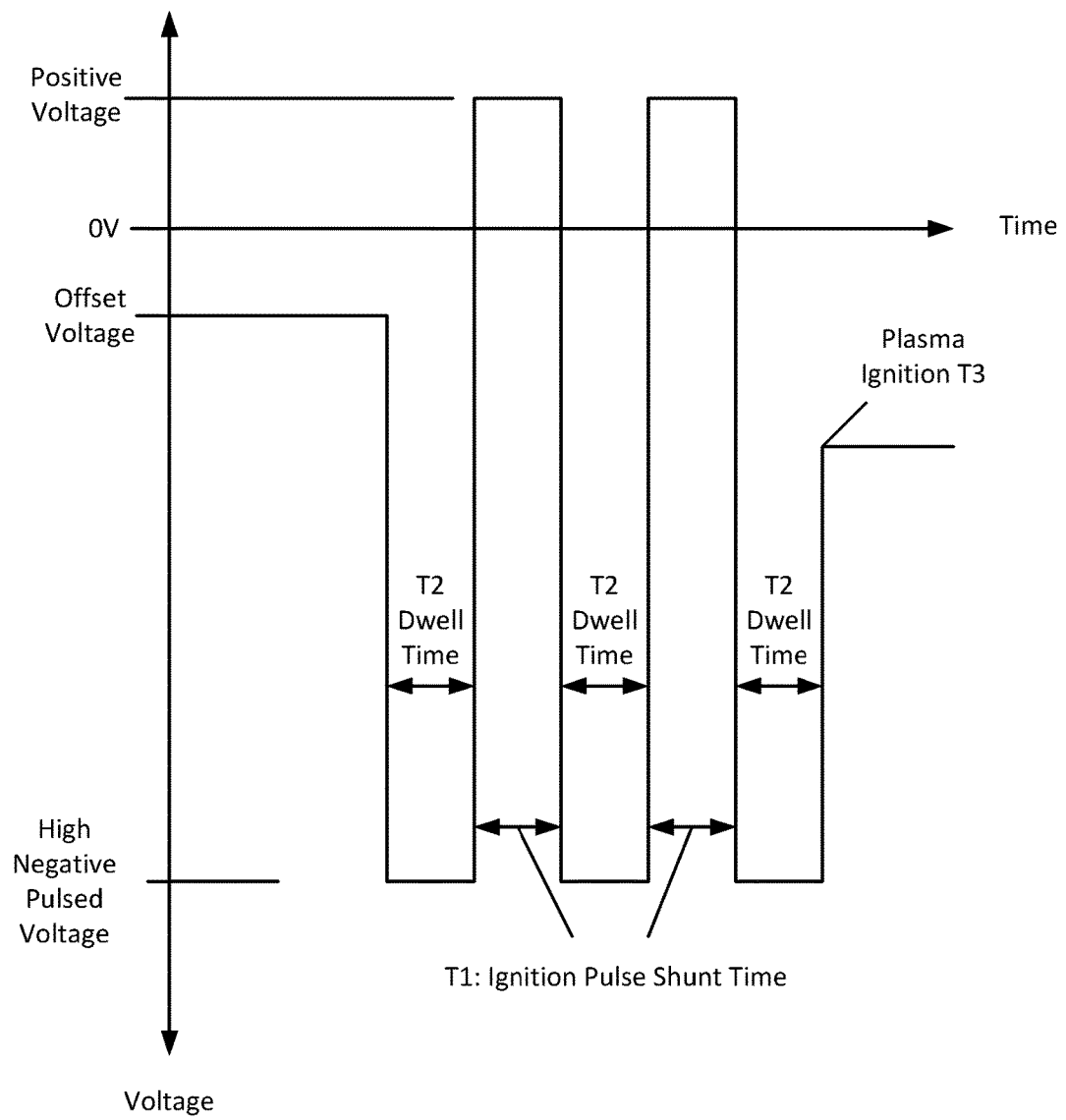
FIG. 3B is an exemplary timing diagram that illustrates the changing of a voltage during a plasma ignition sequence during a voltage reversal operation consistent with the present disclosure.

FIG. 3B is an exemplary timing diagram that illustrates a voltage reversal ignition sequence consistent with the present disclosure. In particular, the reversal operating state of the power supply circuit occurs when the controller closes both switching device S1 and switching device S2 of FIG. 2, for example. Ignition switching devices consistent with the present disclosure may change the voltage across power terminals of a chamber, where the voltage is varied from a voltage that is higher than a nominal operating voltage associated with plasma ignition. In certain instances such ignition switching devices may use a reverse voltage to stimulate plasma ignition. A waveform, consistent with a reverse voltage, is shown in FIG. 3B. The reverse voltage is established when C1 is reversed by closing both S1 and S2 and a voltage associated with capacitor C1 is applied to the chamber, such that chamber 220 terminal 1 is exposed to a voltage that has a reverse polarity of the power supply voltage, this reverse (positive) voltage can approach the negative voltage illustrated in FIG. 3B, although the positive pulse height is illustrated as being less in magnitude than the negative pulse height. Note that an ignition switching device may also perform the function of extinguishing electrical arcs as previously described. In respect to switches S1 and S2 of FIG. 2, these switches may be switched in any sequence appropriate to modifying a voltage applied to a chamber. Such switching sequences include, switching S1 and S2 at different times, switching S1 or S2, or switching S1 and S2 at the same time, for example. Diodes D1 and D2 may prevent capacitor C1 from discharging at times when it is not intended to discharge (when switches S1 and S2 are open). The switching of switches S1 and S2 can be used to change the voltage provided across the chamber. This may result in the voltage applied to chamber 220 to change from an offset voltage to the high negative pulsed voltage illustrated in FIG. 3B. When both switches S1 and S2 are closed, the chamber will be provided with a reverse voltage and this may result in the voltage applied to chamber 220 to switching between the high negative pulsed voltage to the positive voltage illustrated in FIG. 3B. As such, the voltage across the chamber may be driven to the high negative pulsed voltage level (at times T2) of FIG. 3B when switch S2 is closed. Alternatively, a controller may control the application of the high negative pulsed voltage using different circuits not illustrated in the figures. The application of the reverse voltage may be applied to a plasma chamber by closing both switch S1 and S2, resulting in the chamber voltage changing to the positive voltage illustrated in FIG. 3B at times T1. The chamber voltage may be reversed by a reverse voltage by reversing capacitor C1 closing switches S1 and S2. Alternatively, capacitor C1 may be replaced with a power supply that provides the reverse voltage. In certain instances a reverse voltage may correspond to a voltage of the same magnitude, yet different polarity as the voltage applied by power supply terminals/rails 210A and 201B.

As such, using switching components consistent with the present disclosure will more efficiently initiate plasma ignition than alternative approaches where DC power is simply turned on at the ignition voltage and left on until ignition occurs. In general, the frequency at which the switching device is operated may be any frequency. However, it is observed that a higher frequency provides a higher electron flow in the chamber and may result in faster plasma ignition. As reviewed above, when time T2 is 1300 μsec and time T1 is 1400 μsec, then the switching frequency can be calculated by the formula $1/(T2+T2)=1/2700 \, \mu sec = 370.37$ Hertz. Further, the waveform provided in FIG. 3A is but one example of a type of waveform that operation of the switching device in this manner may cause. Those of ordinary skill in the art will be aware of the variables in the waveform that may occur through the frequency switching of the switching device described herein and the waveform may not include sharp edges of a square wave as illustrated in FIGS. 3A and 3B. Furthermore, the switching illustrated in FIGS. 3A and 3B may be implemented using different circuits or components than those illustrated in respect to FIG. 1 and FIG. 2.

In particular, the reverse operating state of the power supply circuit occurs when the controller closes both switching device S1 and switching device S2 of FIG. 2, for example. This may cause the reverse of the polarity of the voltage being applied to the plasma load by applying capacitor C1 across chamber 220 with a reverse polarity. As mentioned above, the application of the reverse voltage, may cause the chamber voltage to switch from the high negative pulsed voltage of FIG. 3B to the positive voltage illustrated in FIG. 3B. Similar to above, both switches may be operated at the same frequency to close at the same time. At this time power supply 210 may attempt to maintain chamber voltage at the rail voltage of power supply 210 and an impedance associated with inductance L1 may cause a voltage to be dropped across inductor L1 when the chamber ignition process is performed. As such, inductor L1 may isolate power supply 210 from the switched voltage applied to a plasma chamber. The operation of the switches may result in a similar waveform as that shown in FIG. 3A. However, in this instance, the voltages pulses applied to the chamber 220 do not alternate between a lower or zero voltage and the ignition voltage, but rather the pulses may vary between a higher voltage and a lower voltage where the nominal operating voltage of the plasma chamber may be between the first and a second voltage applied to the plasma chamber during an ignition process. In other words, by operating a reverse voltage sequence, a higher peak-to-peak voltage is obtained when switching between the operating state and the reversal operating state. This higher peak-to-peak difference may provide even more electron excitation within the chamber 220 to cause a plasma ignition in a lower pressure chamber and drive the chamber voltage negative. This excitation may cause ions to be generated and may cause those ions to move in the plasma chamber. Regardless of whether the shunt operation or the reversal operation is utilized, the switching devices may be controlled by control 250 of FIG. 2 to improve the plasma ignition in processes or chambers that require lower pressures to ignite by controlling how much chamber voltage is changed. Note that FIG. 3B includes many of the same features of FIG. 3A but in the context of a voltage reversal ignition sequence. FIG. 3B includes an initial offset voltage (that may be a voltage other than zero volts), a high voltage negative pulsed voltage at times T2 (dwell times), a positive voltage at times T1 ignition pulse shunt time, and plasma ignition at time T3. Here again the plasma voltage may be a voltage like minus 400 volts and this voltage may vary depending of characteristics of the plasma and characteristics of a plasma generator.

Figure 4:
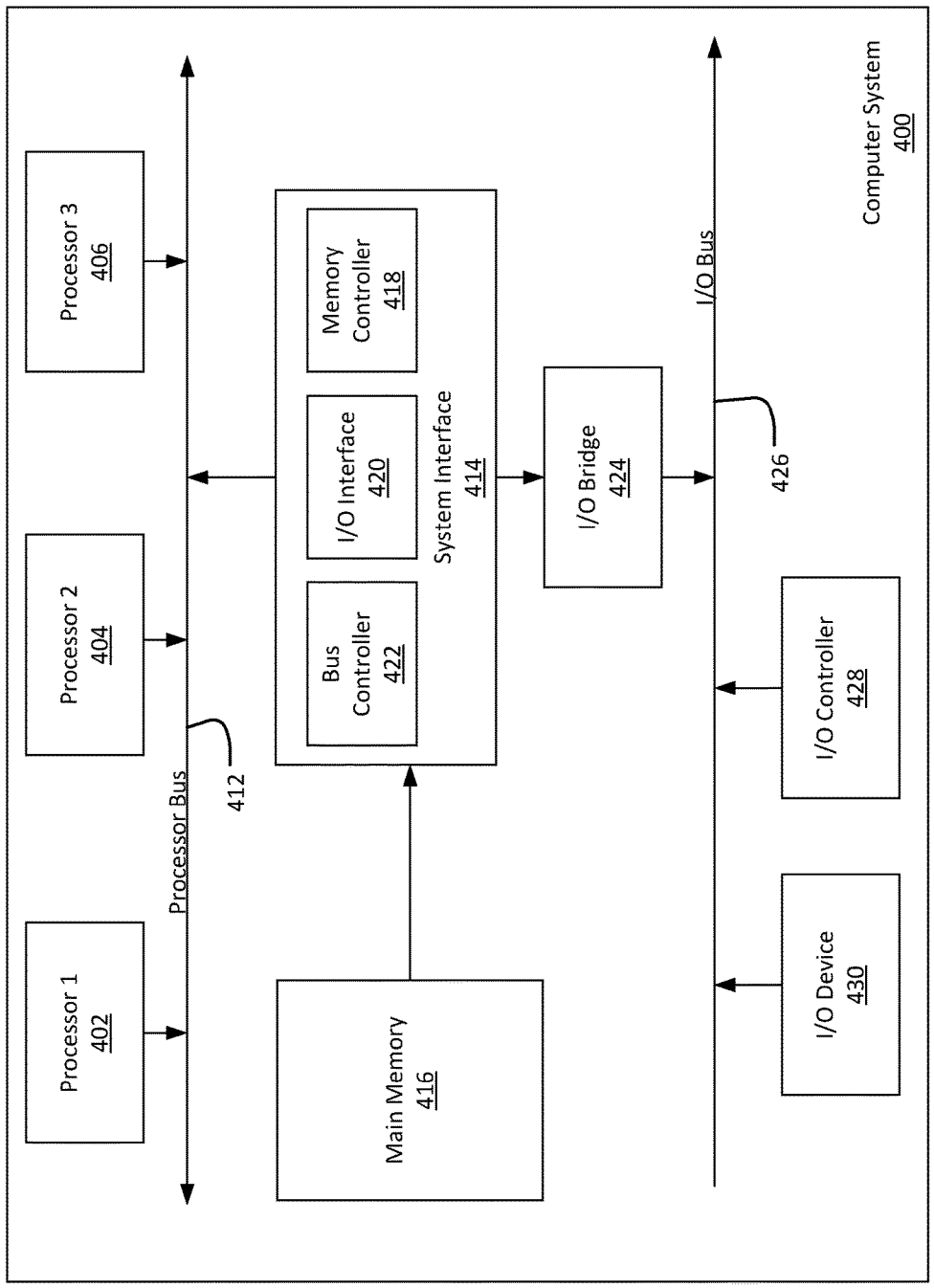
FIG. 4 is a diagram illustrating an example of a computing system which may be used in implementing embodiments of the present disclosure.

FIG. 4 illustrates an exemplary block diagram of a computer system that may be used control the operation of a plasma process. FIG. 4 includes computing device/computer system 400 which may be used in implementing the methods for controlling systems or apparatus consistent with the present disclosure. For example, the computing system 400 of FIG. 4 may be the control device 250 of FIG. 2 discussed above. The computer system (system) may include one or more processors 402, 404, 406 (402-406). Processors 402-406 may include one or more internal levels of cache (not shown) and a bus controller or bus interface unit to direct interaction with the processor bus 412. Processor bus 412, may also be a "host bus" or a "front side bus" that may be used to couple the processors 402-406 with the system interface 414. System interface 414 may be connected to the processor bus 412 to interface other components of the system 400 with the processor bus 412. For example, system interface 414 may include a memory controller 418 for interfacing a main memory 416 with the processor bus 412. The main memory 416 typically includes one or more memory cards and a control circuit (not shown). System interface 414 may also include an input/output (I/O) interface 420 to interface one or more I/O bridges or I/O devices with the processor bus 412. One or more I/O controllers and/or I/O devices may be connected with the I/O bus 426, such as I/O controller 428 and I/O device 430, as illustrated. The system interface 414 may further include a bus controller 422 to interact with processor bus 412 and/or I/O bus 426.

I/O device 430 may also include an input device (not shown), such as an alphanumeric input device, including alphanumeric and other keys for communicating information and/or command selections to the processors 402-406. Another type of user input device includes cursor control, such as a mouse, a trackball, or cursor direction keys for communicating direction information and command selections to the processors 402-406 and for controlling cursor movement on the display device.

System 400 may include a dynamic storage device, referred to as main memory 416, or a random access memory (RAM) or other computer-readable devices coupled to the processor bus 412 for storing information and instructions to be executed by the processors 402-406. Main memory 416 also may be used for storing temporary variables or other intermediate information during execution of instructions by the processors 402-406. System 400 may include a read only memory (ROM) and/or other static storage device coupled to the processor bus 412 for storing static information and instructions for the processors 402-406. The system set forth in FIG. 4 is but one possible example of a computer system that may employ or be configured in accordance with aspects of the present disclosure.

According to one embodiment, the above techniques may be performed by computer system 400 in response to processor 404 executing one or more sequences of one or more instructions contained in main memory 416. These instructions may be read into main memory 416 from another machine-readable medium, such as a storage device. Execution of the sequences of instructions contained in main memory 416 may cause processors 402-406 to perform the process steps described herein. In alternative embodiments, circuitry may be used in place of or in combination with the software instructions. Thus, embodiments of the present disclosure may include both hardware and software components.

A machine readable medium includes any mechanism for storing or transmitting information in a form (e.g., software, processing application) readable by a machine (e.g., a computer). Such media may take the form of, but is not limited to, non-volatile media and volatile media. Non-volatile media includes optical or magnetic disks. Volatile media includes dynamic memory, such as main memory 416. Common forms of machine-readable medium may include, but is not limited to, magnetic storage medium; optical storage medium (e.g., CD-ROM); magneto-optical storage medium; read only memory (ROM); random access memory (RAM); erasable programmable memory (e.g., EPROM and EEPROM); flash memory, hard disk drives; or other types of medium suitable for storing electronic instructions. Control systems consistent with the present disclosure may also include devices that communicate wirelessly using any standard wireless communication technology including yet not limited to WiFi or BLUETOOTH™.

Embodiments of the present disclosure include various steps, which are described in this specification. The steps may be performed by hardware components or may be embodied in machine-executable instructions, which may be used to cause a general-purpose or special-purpose processor programmed with the instructions to perform the steps. Alternatively, the steps may be performed by a combination of hardware, software and/or firmware. Control components may include conventional computers, processors, digital signal processors (DSP), graphic processors, digital logic, or analog devices. Control components may be implemented by devices that include application specific integrated circuit (ASICS) or field programmable gate arrays (FPGAS).

The description above includes example systems, methods, techniques, instruction sequences, and/or computer program products that embody techniques of the present disclosure. However, it is understood that the described disclosure may be practiced without these specific details. In the present disclosure, the methods disclosed may be implemented as sets of instructions or software readable by a device. Further, it is understood that the specific order or hierarchy of steps in the methods disclosed are instances of example approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

It is believed that the present disclosure and many of its attendant advantages should be understood by the foregoing description, and it should be apparent that various changes may be made in the form, construction and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it should be understood that these embodiments are illustrative and that the scope of the disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

The invention claimed is:

1. A method for igniting plasma in a direct current (DC) plasma system, the method comprising:
   providing an applied voltage to a low pressure environment plasma chamber of a DC powered plasma system at a first voltage level for a first time period, the first voltage level different from an operating DC voltage level of the plasma chamber;
   changing, prior to ignition of a plasma in the plasma chamber, the applied voltage provided to the plasma chamber to a second voltage level for a second time period, wherein the second voltage level is different from the operating DC voltage level of the plasma chamber and the operating DC voltage level is between the first voltage level and the second voltage level;
   returning the applied voltage to the plasma chamber to the first voltage level, wherein the voltage applied to the plasma chamber is alternated between the first voltage level and the second voltage level until the plasma is ignited in the plasma chamber; and
   providing, after the plasma is ignited in the plasma chamber and for a third time period, the applied voltage to the operating DC voltage level of the plasma chamber to maintain the plasma in the plasma chamber, wherein the third time period is longer than a combined first time period and second time period.

2. The method of claim 1, wherein the first voltage level corresponds to a negative voltage level and the second voltage level corresponds to a voltage level that is more negative than the negative voltage level.

3. The method of claim 1, wherein:
   the plasma chamber is electrically connected to an upper rail and a lower rail that connect, respectively to a first and a second output of a power supply, the upper rail at the first voltage level;
   the second voltage level is provided by closing a first switch biasing a first diode to conduct, the conduction of the first diode forming an electrical conductive path between the lower rail and the upper rail; and
   the first voltage level is provided by opening the first switch to remove the conducting bias on the first diode, wherein the voltage applied to the plasma chamber is changed between the first voltage level and the second voltage level until a plasma is ignited in the plasma chamber by closing and opening the first switch.

4. The method of claim 1, wherein the providing of the first voltage level and the changing of the applied voltage is controlled by a controller at an identified frequency.

5. The method of claim 4, further comprising receiving one or more control signals from the controller that switches the applied voltage between the first voltage level and the second voltage level.

6. The method of claim 1, wherein the second voltage level is the same magnitude of the first voltage level and an opposite polarity relative to a reference voltage.

7. The method of claim 1, further comprising:
   charging a capacitor when a first switch and a second switch electrically coupled to a voltage reversal circuit are open, the charging of the capacitor based on a first diode and a second diode conducting when the first diode and the second diode are forward biased, wherein:
   the first diode is electrically connected to an upper rail of the DC powered plasma system and to a first side of the capacitor, and
   the second diode is electrically connected to a lower rail of the DC powered plasma system and to a second side of the capacitor, closing the first switch and the second switch to reverse the applied voltage to the plasma chamber based on electrically connecting the second side of the capacitor to the upper rail of the DC powered plasma system and based on electrically connecting the first side of the capacitor to the lower rail of the DC powered plasma system, and opening the first and the second switch to return the applied voltage to the first voltage level.

8. The method of claim 7, further comprising:

identifying an arcing condition associated with the plasma chamber; and closing the first switch and the second switch to reverse the applied voltage to the plasma chamber based on electrically connecting the second side of the capacitor to the upper rail of the DC powered plasma system and based on electrically connecting the first side of the capacitor to the lower rail of the DC powered plasma system.

9. An apparatus for initiating plasma ignition in a direct current (DC) plasma system, the apparatus comprising:

a controller; and the controller controls an applied voltage to a low pressure environment plasma chamber of the DC plasma system at a first voltage level for a first time period, the controller, prior to ignition of a plasma in the plasma chamber, changes the applied voltage provided to the plasma chamber to a second voltage level for a second time period by affecting an upper supply rail connection to the DC plasma system, the controller alternates the voltage applied to the plasma chamber between the first voltage level and the second voltage level by controlled connection of the upper supply rail to the DC plasma system until plasma is ignited at the plasma chamber, and the controller changes, after the plasma is ignited at the plasma chamber and for a third time period, the applied voltage to an operating DC voltage level of the plasma chamber to maintain the plasma in the plasma chamber, wherein the operating DC voltage level is between the first voltage level and the second voltage level and the third time period is longer than a combined first time period and second time period.

10. The apparatus of claim 9, wherein the first voltage level corresponds to a negative voltage level.

11. The apparatus of claim 9, further comprising:

an upper rail and a lower rail that respectively electrically connect to a first and a second voltage input of the plasma chamber;

a first switch; and a first diode, wherein:

the second voltage level is provided by closing the first switch based on biasing the first diode to conduct, the conduction of the first diode forming an electrical conductive shunt path between the upper rail and the lower rail; and the first voltage level is provided at the upper rail when the first switch is open.

12. The apparatus of claim 9, wherein the controller includes at least one of a processor that executes instructions out of a memory, a field programmable gate array (FPGA), an application specific integrated circuit (ASIC), digital logic, or analog components.

13. The apparatus of claim 9, further comprising:

a capacitor; an upper rail of the DC plasma system;

a lower rail of the DC plasma system;

a first switch and a first diode coupled between the upper rail and the lower rail; and a second switch and a second diode coupled between the upper rail and the lower rail, wherein:

the capacitor is charged when the first switch and the second switch electrically coupled to a voltage reversal circuit are open, the first diode is electrically connected to the upper rail of the DC plasma system and to a first side of the capacitor, the second diode is electrically connected to the lower rail of the DC plasma system and to a second side of the capacitor, the first switch and the second switch are closed to reverse the applied voltage to the plasma chamber based on electrically connecting the second side of the capacitor to the upper rail of the DC plasma system and based on electrically connecting the first side of the capacitor to the lower rail of the DC plasma system, and the first and the second switch are opened to return the applied voltage to the first voltage level.

14. The apparatus of claim 13, wherein:

an arcing condition associated with the plasma chamber is identified, the first switch and the second switch are closed to reverse the applied voltage to the plasma chamber based on electrically connecting the second side of the capacitor to the upper rail of the DC plasma system and based on electrically connecting the first side of the capacitor to the lower rail of the DC plasma system.

15. The apparatus of claim 14, wherein the plasma chamber is restarted by changing the applied voltage between the first voltage level and the second voltage level and back to the first voltage level is performed at an identified frequency until plasma is ignited at the plasma chamber.

16. The apparatus of claim 9, further comprising a voltage source that is controllably switched by one or more switches to provide an electrical voltage associated with the voltage source to one or more terminals of a plasma chamber.

17. An apparatus for initiating plasma ignition in a direct current (DC) plasma system, the apparatus comprising:

an upper rail and a lower rail that are disposed to form an electrical link between a low pressure environment DC plasma chamber and a first and a second output, respectively of a power supply;

a plurality of switches that electrically couples a voltage changing circuit to at least one of the upper rail or the lower rail of the power supply when at least one of the plurality of switches are closed; and a control component coupled to the plurality of switches that controls switching between at least a first switch configuration and a second switch configuration, wherein the control component controls:

the closure of at least a first switch of the plurality of switches to electrically couple the voltage changing circuit to at least one of the upper rail or the lower rail of the power supply to provide a first voltage to the DC plasma chamber for a first time period, the closure of the first switch corresponding to the first switch configuration, the first switch and a second switch of the plurality of switches to open or close according to the second switch configuration, the second switch configuration providing, prior to ignition of a plasma in the DC plasma chamber, a second voltage to the DC plasma chamber for a second time period, switching between the first switch configuration and the second switch configuration until the ignition of the plasma occurs based on switching between the first voltage and the second voltage provided to the DC plasma chamber, and the opening of the first switch and the second switch of the plurality of switches, after the plasma is ignited and for a third time period, to provide an operating DC voltage to the DC plasma chamber, wherein the third time period is longer than a combined first time period and second time period.

18. The apparatus of claim 17, wherein the voltage changing circuit includes an energy source.

19. The apparatus of claim 18, further comprising:
a capacitor;
a first diode serially coupled with the first switch between the upper and lower rail; and
a second diode serially coupled with the second switch between the upper and the lower rail, wherein:
the capacitor is positioned to provide a charge path through the first diode and the second diode when the first switch and the second switch are open,
the first switch and the second switch are closed to reverse the applied voltage to the DC plasma chamber based on electrically connecting the capacitor to the upper rail and the lower rail.

20. The method of claim 1 wherein the low pressure environment plasma chamber of the DC powered plasma system comprises a pressure of less than 1 millitorr.

21. The apparatus of claim 9 wherein the low pressure environment plasma chamber of the DC plasma system comprises a pressure of less than 1 millitorr.

* * * * *